United States Patent [19]
Ito et al.

[11] Patent Number: 5,097,389
[45] Date of Patent: Mar. 17, 1992

[54] STRUCTURE FOR FIXING FEEDTHROUGH CAPACITOR IN HIGH-FREQUENCY DEVICE AND MANUFACTURING METHOD OF HIGH-FREQUENCY DEVICE

[75] Inventors: Katsuo Ito; Kazunori Kinoshita; Kazuhiro Tsuji, all of Nagaokakyo, Japan

[73] Assignee: Murata Manufacturing Co., Ltd., Nagaokakyo, Japan

[21] Appl. No.: 487,840

[22] Filed: Mar. 5, 1990

[30] Foreign Application Priority Data

Mar. 3, 1989 [JP] Japan ................................. 1-24852

[51] Int. Cl.$^5$ ............................................. H05K 9/00
[52] U.S. Cl. ................................... 361/424; 174/35 R
[58] Field of Search ................... 175/35 R; 361/424

[56] References Cited

U.S. PATENT DOCUMENTS

| | | | |
|---|---|---|---|
| 4,747,019 | 5/1988 | Ito et al. | 174/35 R |
| 4,761,712 | 8/1988 | Ito et al. | 361/417 |
| 4,842,555 | 6/1989 | Cosmos et al. | 174/35 C |

Primary Examiner—Gregory D. Thompson
Attorney, Agent, or Firm—Wenderoth, Lind & Ponack

[57] ABSTRACT

A high frequency device having a shield casing with the interior divided into small sections by shield plates, and with circuit blocks of a high frequency circuit in the respective sections including substrates with circuit components on the upper surface with terminals extending through the substrate to a printed circuit on the lower surface. A feedthrough capacitor is mounted in the casing or in the shield plate, or both, in a level corresponding to the level of the substrate, such that the feedthrough terminal of the capacitor extends adjacent the printed circuit, and such that, when the device is immersed in solder to solder the terminals of the components to the printed circuit, the feedthrough terminal of the capacitor is also soldered to the printed circuit and the capacitor itself is also soldered to the casing or the shield plate. Further, steadying fingers are provided around the fixing hole portion in the casing or plate, and these are spaced around the periphery of the fixing hole portion so that the two fingers nearest the bottom edge of the casing or plate are a maximum distance from the edge, so as to maximize the resistance of the casing or plate to distortion when the fingers are bent laterally from within the fixing hole portion.

4 Claims, 4 Drawing Sheets

STRUCTURE FOR FIXING FEEDTHROUGH CAPACITOR IN HIGH-FREQUENCY DEVICE AND MANUFACTURING METHOD OF HIGH-FREQUENCY DEVICE

This invention relates to a structure for fixing a feedthrough capacitor to a shield case or a shield plate in a high-frequency device such as a tuner or the like of a cable television, and to a method of manufacturing a high-frequency device provided with a shield case or a shield plate and a feedthrough capacitor.

BACKGROUND OF THE INVENTION

Generally, a circuit of a high-frequency device, like a tuner of a cable television, is constructed of a plurality of circuit blocks, each of which is mutually shielded by a shield plate so as to be prevented from mutual electromagnetic interference. The required electric connection is obtained by a feedthrough capacitor connected between a circuit outside the shield case and the above-described circuit block or between two circuit blocks.

As an example of a high-frequency device of this kind, a structure of a tuner of a cable television is shown in FIGS. 7 and 8.

As shown in FIG. 7, tuner 1 has frame-shaped shield case 4 formed of two metal plates 2 and 3 having the same width. One of the metal plates 2 forming case 4 has sides bent at a right angle from both ends thereof, which sides are connected by the other metal plate 3. The inside of the case 4 is divided by shield plates 5 into a plurality of small sections 6. Within respective sections 6 are secured circuit blocks 7 as shown in FIG. 8.

To facilitate production efficiency of tuner 1, adjacent circuit blocks 7 are integrally constructed on a printed substrate 9 having the parts mutually connected by means of connecting portions 8, with required electronic components 11 (see FIG. 9) mounted thereon. Upon fixing an appropriate circuit block 7 to the inside of each small section 6 of case 4, respective portions 8 fit in notches 12 formed in shield plates 5, and shield plates 5 are fitted into slits 13 between adjacent blocks 7. Within shield case 4 the printed substrate 9 is positioned at a position defined by the position of notches 12 formed in plates 5 and projections 14 on case 4.

In fixing hole portions 16 for feedthrough capacitors 15 and formed in case 4 or plates 5 are fixed feedthrough capacitors 15 and the external conductors formed on the surface thereof are soldered to shield case 4 of shield plates 5, whereby the required electric connections are obtained between a circuit (not shown) outside of case 4 and the above-described circuit blocks 7, or between two circuit blocks 7. In FIGS. 7 and 8 an example is shown wherein feedthrough capacitor 15 is fixed to metal plate 3 forming the shield case 4.

At the top and bottom of shield case 4 covers are provided (not shown), having slits which engage with torsion tabs 18 formed on case 4, and the covers are secured by twisting said tabs.

A tuner 1 of a cable television having such a construction has conventionally had a structure for fixing a feedthrough capacitor 15 as explained below.

A fixing hole 16 for a feedthrough capacitor 15 is positioned in case 4 or a plate 5 in such a manner that the feedthrough capacitor 15 is above the surface on the opposite side of substrate 9 from wiring pattern-containing surface 9a of the printed substrate 9 as shown in FIG. 9, and a connecting portion 8 of the circuit block 7 is brought into contact with the bottom of notch 12 in a shield plate 5 and printed substrate 9 abuts against a projection 14 of the shield case 4. The external conductor of a capacitor 15 fixed to the portion of the case 4 around hole 16 and is soldered to case 4 or plate 5 and the feedthrough terminal 19 thereof which is bent midway of its length at a right angle and is inserted through hole 9b of substrate 9 from the side opposite to the wiring pattern-containing surface 9a (see FIG. 8) of substrate 9 together with the terminals of other electronic components 11, and then the structure is immersed into molten solder 21 to solder the terminals to the wiring pattern (not shown) of circuit block 7 (printed substrate 9), as shown in FIG. 9.

With such a conventional structure for fixing a feedthrough capacitor 15 as described above, the fixing hole portion 16 therefor is formed in the shield case 4 or shield plate 5 spaced from the side of substrate 9 opposite to pattern-containing surface 9a of substrate 9. For this reason, the fixing structure has posed a problem in that, prior to simultaneous processes of immersing into molten solder 21 and soldering the terminals to the pattern of circuit block 7 (printed substrate 9) the feedthrough terminal 19 of capacitor 15 must be inserted through a hole (not shown) in substrate 9 together with terminals of electronic components 11, which process necessitates much time and labor in fixing the feedthrough capacitor 15. In this process, it is first necessary to fit capacitor 15 in the hole portion 16 and solder the external conductor of the conventional structure for fixing the feedthrough capacitor 15, solder which solders the external conductor of capacitor 15 to the shield case 4 or shield plate 5 may be melted by the heat generated at the time of immersing the case 4 and substrate 9 into molten solder 21, thus causing the feedthrough capacitor 15 to be tilted.

Hence, the problem to be solved by the present invention is to provide a structure for both fixing a feedthrough capacitor in a high-frequency device wherein electronic components are to be soldered to the wiring pattern on a printed substrate at the same time, and permitting the soldering of the feedthrough capacitor to the shield case or shield plate, and to provide a method of manufacturing such a high-frequency device.

BRIEF SUMMARY OF THE INVENTION

Accordingly, for solving the problems described above, the present invention provides a structure for fixing the feedthrough capacitor in a shield case the inside of which is divided into a plurality of small sections by shield plates and circuit blocks of a high-frequency circuit constructed on a printed substrate are secured within respective sections, said capacitor being electrically connected between an external circuit constituted by the shield case and a circuit block, or between two circuit blocks. A fixing hole portion, formed in the shield case or shield plate for fixing the feedthrough capacitor, has the center thereof substantially at the mounting position of the printed substrate with the respective circuit blocks of the high-frequency circuit formed thereon. Moreover, the hole portion has temporary steadying fingers which engage the outer circumferential surface of the feedthrough capacitor when it is fitted into the shield case or shield plate to thereby temporarily secure it. The feedthrough terminal of the capacitor is positioned and fixed on the wiring pattern surface of the printed substrate.

The invention provides a manufacturing method wherein the printed substrate is secured to the shield case having inside thereof divided by shield plates into a plurality of small sections, a fixing hole portion in which the feedthrough capacitor is fitted in is formed in the shield case or shield plate with the center thereof substantially at the fixing position of the printed substrate, the capacitor fitted in the fixing hole portion is temporarily secured by temporary steadying fingers provided around the hole portion to thereby position the feedthrough terminal of the capacitor on the wiring pattern surface of the substrate, and the shield case is immersed into molten solder to thereby solder simultaneously all the parts requiring soldering.

The temporary steadying fingers engage the outer circumferential surface of the feedthrough capacitor when it is fitted into the shield case or plate so as to temporarily secure it. The central part of the fixing hole portion is substantially at the fixing position of the printed substrate, thus bringing the feedthrough terminal of the capacitor into contact with the wiring pattern of the printed substrate with a result that the capacitor is positioned substantially on the same level as the substrate, whereby upon immersing said substrate into molten solder up to the wiring pattern surface level thereof, terminals of the electronic components secured to the substrate are soldered to the wiring pattern-containing surface thereof, and at the same time the external conductor of the capacitor is soldered to the shield case or plate, and the feedthrough terminal thereof is also soldered to the wiring pattern on the above-described substrate.

DETAILED DESCRIPTION OF THE INVENTION

An example of the present invention is described below based on the accompanying drawings.

Figure 1:
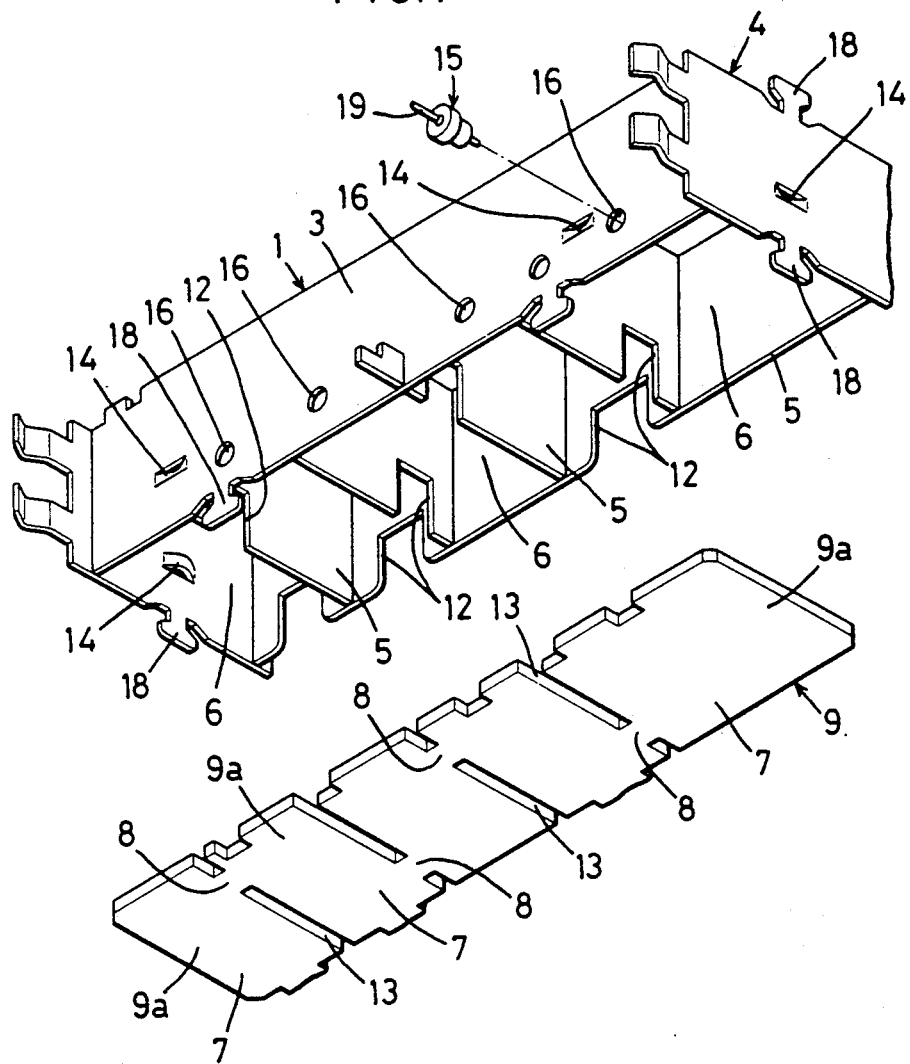
FIG. 1 is an exploded perspective view showing one example of a structure for fixing a feedthrough capacitor according to the present invention.
Figure 7:
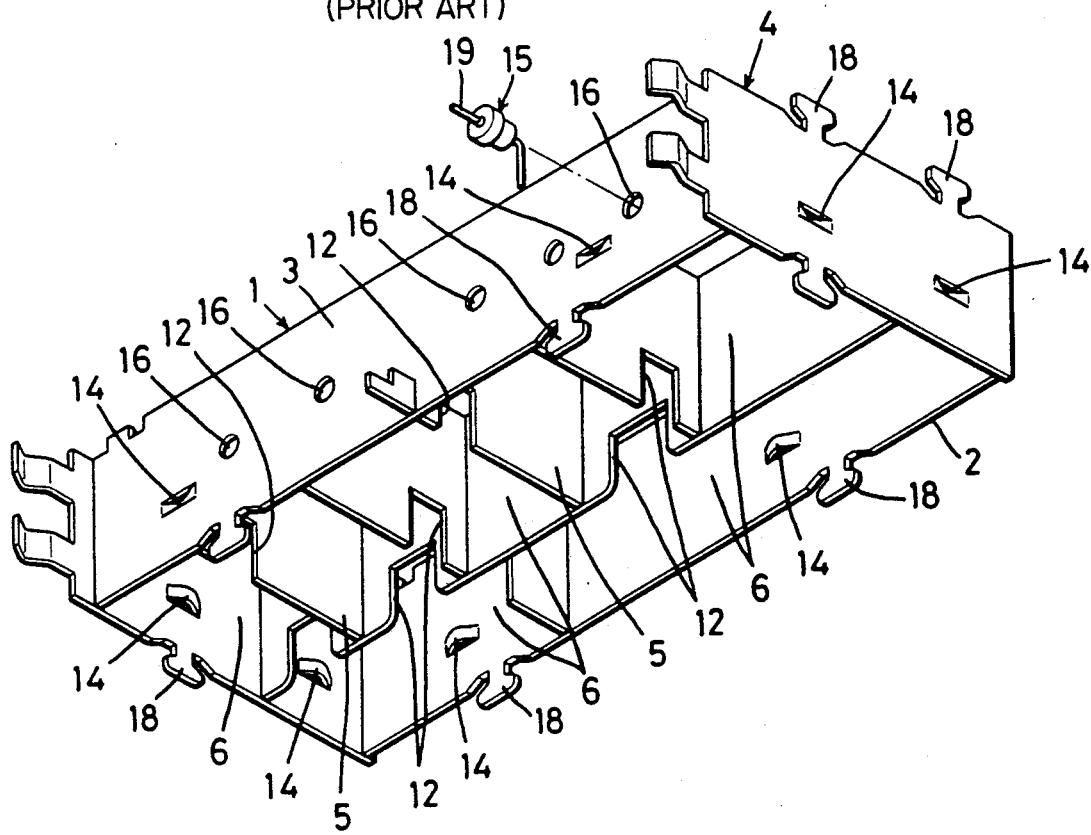
FIG. 7 is a perspective view of a shield case for a tuner having a conventional structure for fixing a feedthrough capacitor thereto.
Figure 8:
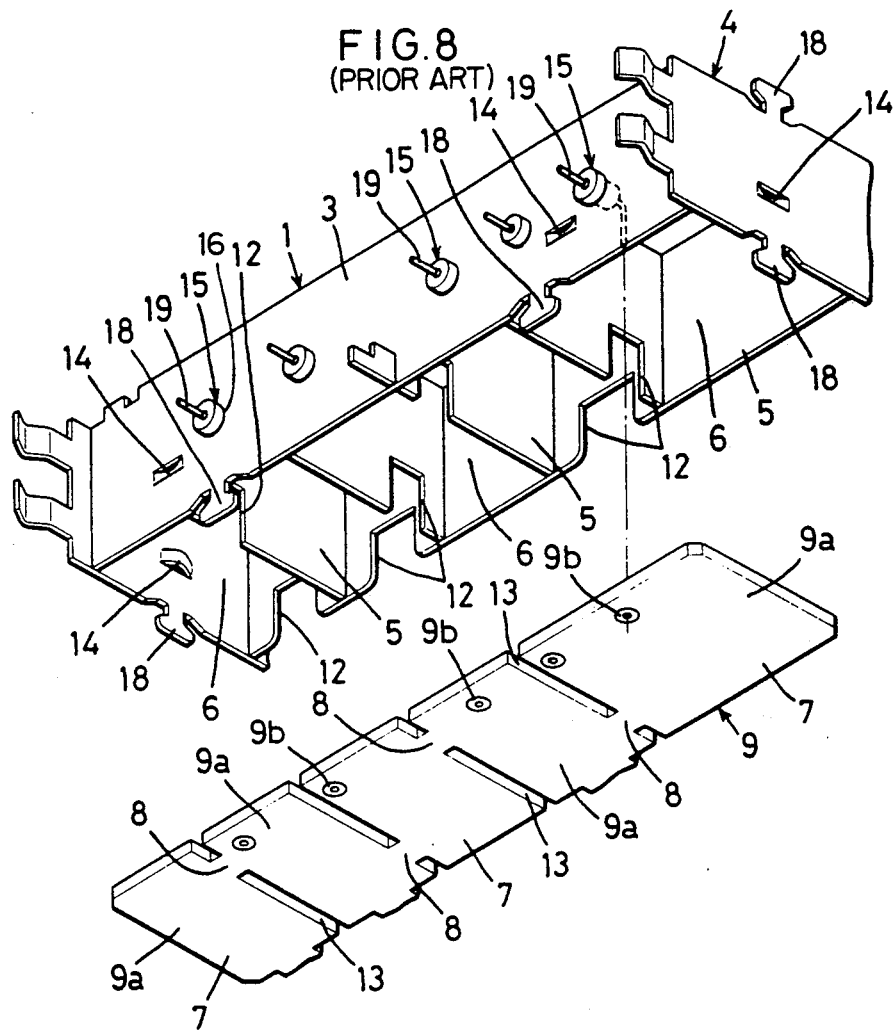
FIG. 8 is an exploded perspective view of the shield case of FIG. 7.
Figure 9:
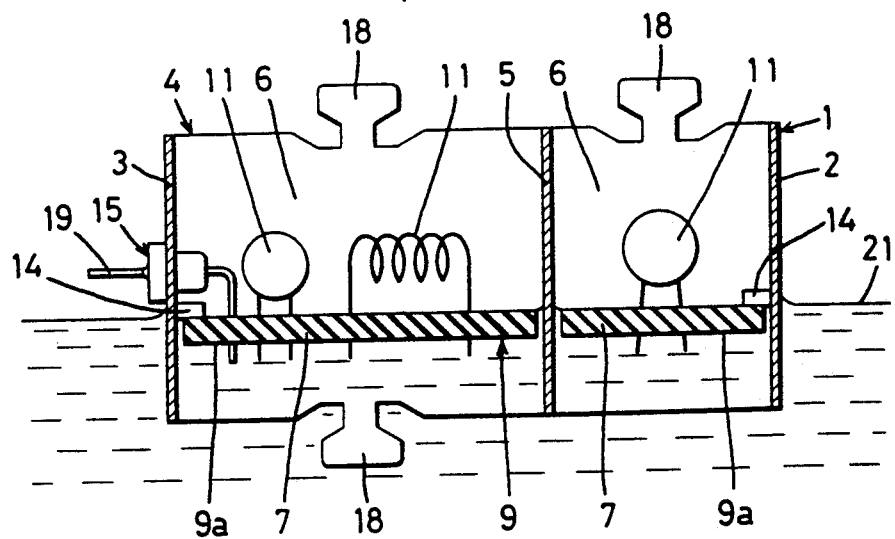
FIG. 9 is a view similar to FIG. 6 of a feedthrough capacitor mounted in a casing of FIG. 7 with the terminal being soldered to a substrate.

The structure for fixing a feedthorugh capacitor 15 according to the present invention is applied to a shield case as shown in FIG. 1 for holding a tuner for a cable television similar to that explained hereinbefore in connection with FIGS. 7–9.

In FIGS. 1–6, the same parts as or equivalent to those in FIGS. 7–9 are designated by the same reference numerals.

Figure 2:
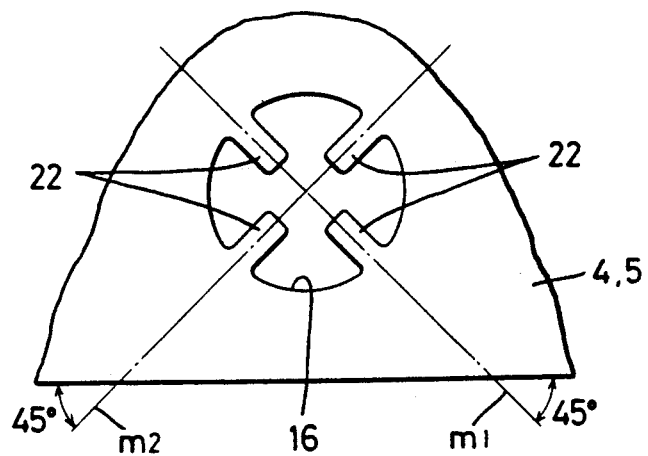
FIG. 2 is a partial elevation view, on an enlarged scale, of a shield case or shield plate showing temporary steadying fingers extending into the inside of the fixing hole portion.

In the tuner for a cable television housed in a shield case as shown in FIG. 1, feedthrough terminal 19 is fixed on wiring pattern-containing surface 9a of printed substrate 9 in the tuner by locating the central part of the fixing hole portion 16 formed in the shield case 4 of a shield plate 5 at a level which corresponds substantially to the level of the wiring pattern-containing surface 9a on the mounting position of printed substrate 9 having respective circuit blocks 7 of above-described high-frequency circuit thereon. As shown in FIG. 2, the hole portion 16 is provided with four temporary steadying fingers 22 to temporarily engage the outer circumferential surface of the capacitor 15 when the capacitor is fitted thereinto, and to secure it.

Figure 3A:
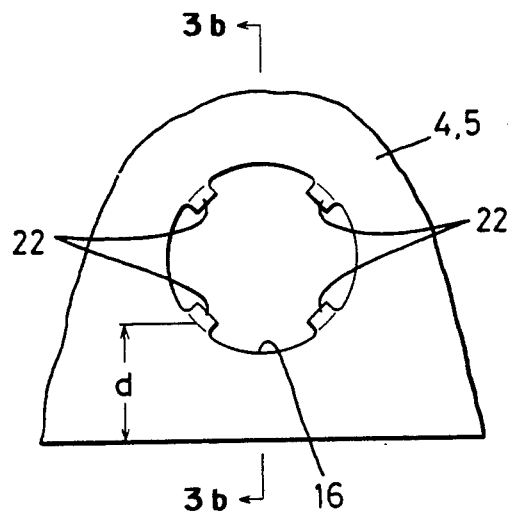
FIG. 3(a) is a view similar to FIG. 2 of the shield case or plate showing the temporary steadying fingers of FIG. 2 after being bent.
Figure 3B:
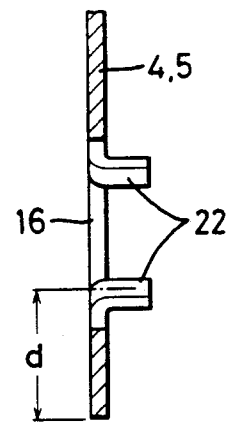
FIG. 3(b) is a cross-sectional view taken along the line 3b—3b of FIG. 3(a)

These fingers 22 are located on two lines $m_1$ and $m_2$, formed at an angle of 45° to a lower end edge of the shield case 4 or shield plate 5, in a manner so that the respective fingers extend inward of hole portion 16, as shown in FIG. 2. Then they are bent at the respective bases thereof toward the same surface side of shield case 4 or shield plate 5 as shown in FIGS. 3(a) and 3(b).

The temporary steadying fingers 22 are positioned on the lines $m_1$, $m_2$ in order to obtain the longest possible distance d between finger 22 and the lower end edge of case 4 or plate 5, to thereby increase the strength of the case or plate between the finger and the lower end edge, thus preventing the case or plate from being deformed by bending of the finger 22.

Next, the method of manufacturing the high-frequency device using the above-described structure for mounting the capacitors is described below.

Figure 4A:
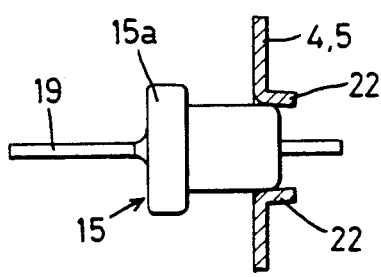
FIGS. 4(a) and 4(b) are partial sectional elevation views illustrating respectively the feedthrough capacitor temporarily fixed to the shield case or plate.
Figure 4B:
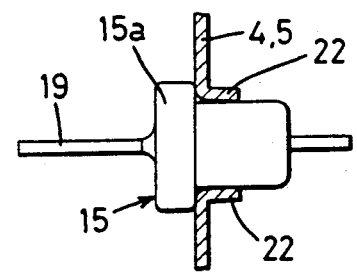

The printed substrate 9 having required electronic components 11 fixed thereto is disposed inside the shield case 4 divided into a plurality of small sections 6 by shield plates 5. Next, a feedthrough capacitor 15 is pressed into a fixing hole portion 16 for a feedthrough capacitor 15 and formed in shield case 4 or shield plate 5 until the flange portion 15a thereof abuts against case 4 or plate 5 as shown in FIGS. 4(a) and 4(b). In this condition, temporary steadying fingers 22 press against the outer circumferential surface of capacitor 15 to thereby temporarily secure it to case 4 or plate 5 with the feedthrough terminal 19 projecting into a section 6 substantially perpendicular to the case 4 or plate 5.

Figure 5:
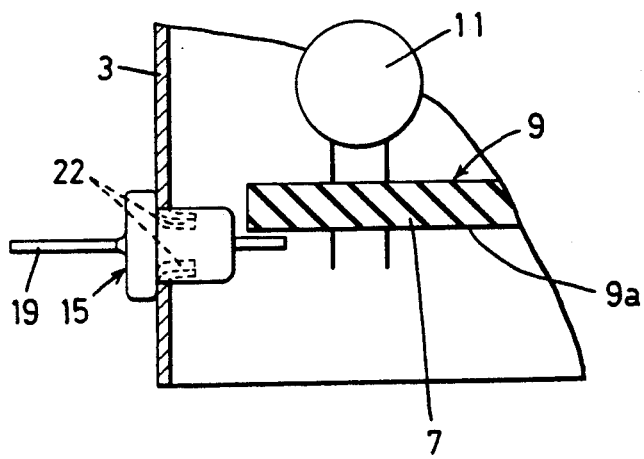
FIG. 5 is a fragmentary sectional view showing the positional relation between the feedthrough terminal of the feedthrough capacitor and the printed substrate.

In this condition, feedthrough terminal 19 of capacitor 15 is in contact with or close to the wiring pattern surface 9a of the printed substrate 9 fitted in shield case 4 before the capacitor 15 is temporarily secured as shown in FIG. 5.

Figure 6:
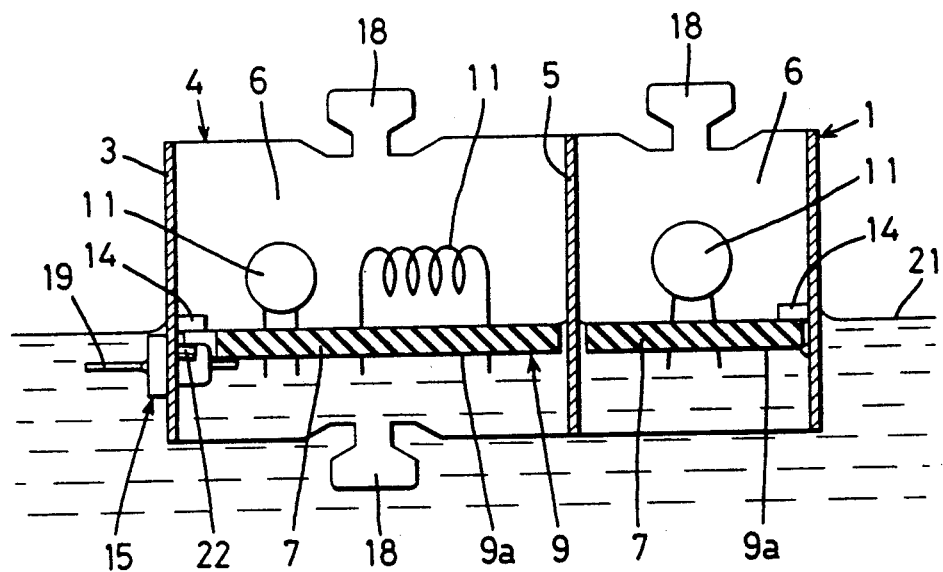
FIG. 6 is a sectional elevation view of a feedthrough capacitor being soldered according to the method of the present invention.

With printed substrate being mounted inside the shield case 4 and feedthrough capacitor 15 being temporarily fixed to case 4 or plate 5, the shield case 4 is immersed, wiring pattern-containing surface 9a of printed substrate 9 face downward, into molten solder 21 as shown in FIG. 6 and then pulled out, whereby the terminals of the electronic components are soldered to the wiring pattern of printed substrate 9, and at the same time the external conductor of capacitor 15 is securely soldered to case 4 or plate 5 and the finger 22. In addition, feedthrough terminal 19 is also soldered to the wiring pattern on the substrate 9.

Accordingly, all parts requiring soldering are simultaneously soldered. In addition, there is no necessity for bending the terminal 19 and soldering feedthrough capacitor 15 to shield case 4 or shield plate 5 beforehand, and soldering of the terminals of electronic components 11 to the wiring pattern on printed substrate 9 and soldering feedthrough capacitor 15 to the case 4 or plate 5 can be conducted at the same time.

The present invention is adapted not only for forming a tuner for a cable television but also to such high-frequency devices as a tuner for ordinary television sets, and telephones used in cars.

The temporary steadying fingers 22 at fixing hole portion 16 need not necessarily be formed in the position as in the examples shown above, if shield case 4 or shield plate 5 has sufficient strength to withstand deformation when the fingers are bent. Also, the fingers need not always be limited to four in number, as more than five or less than three may suffice. If there is a fear that shield case 4 or shield plate 5 will be deformed when the fingers 22 are bent, the fingers are preferably positioned at places as far as possible from the edge of shield case 4 or shield plate 5 regardless of the number thereof.

EFFECTS OF THE INVENTION

Since the feedthrough capacitor is on substantially the same level as the printed substrate and, when temporarily pressed and secured at the outer circumferential surface thereof by the temporary steadying fingers, immersion into molten solder of the printed substrate up to the level of the wiring pattern-containing surface thereof will cause the terminals of the electronic components to be soldered to the wiring pattern on the substrate and the capacitor to be soldered, without the necessity of bending the feedthrough terminal and soldering the capacitor to the shield case or plate beforehand, to thereby facilitate mounting the feedthrough capacitor. Moreover, due to solder stuck to at least some of the temporary steadying fingers, the capacitor is positively secured to the case or plate.

Furthermore, soldering the terminals of the electronic components fixed on the substrate to the wiring pattern and soldering the capacitor to the shield case or shield plate can be conducted at the same time, thus enabling high-frequency devices to be efficiently manufactured.

What is claimed is:

1. A high frequency device comprising:
   a shield case with a plurality of shield plates dividing the inside of said shield case into a plurality of small sections;
   a printed circuit substrate mounted within each of said small sections and having circuit components of a high frequency circuit mounted on an upwardly facing surface of said printed substrate and a printed circuit on a downwardly facing surface of said printed substrate with the terminals of said circuit components extending through said printed substrate;
   at least one of said shield case and said shield plates having a fixing hole portion therein with a central portion thereof substantially level with the downwardly facing surface of said printed substrate, said fixing hole portion having a plurality of temporary steadying fingers spaced around the periphery thereof and bent laterally of said shield case or shield plate; and
   a feedthrough capacitor having a feedthrough terminal extending axially therethrough and positioned in said fixing hole portion with said temporary steadying fingers pressing against the outer periphery of said feedthrough capacitor for holding said feedthrough capacitor in said fixing hole portion with said feedthrough terminal at least adjacent said downwardly facing surface of said printed substrate,
   whereby by immersing said device in solder to the level of the downwardly facing surface of said printed substrate, the terminals of said circuit components and said feedthrough terminal can be soldered to said printed circuit and at the same time said feedthrough capacitor can be soldered to said shield case or said shield plate.

2. A device as claimed in claim 1 in which said temporary steadying fingers are spaced equidistantly around said fixing hole portion, and two temporary steadying fingers in said plurality which are located closest to the edge of the shield case or the shield plate closest to said hole portion are located so as to be at the maximum distance from said edge.

3. A device as claimed in claim 1 in which there are four temporary steadying fingers and they lie along lines at forty-five degrees to said edge.

4. A method of manufacturing a high frequency device, comprising:
   providing a shield case with a plurality of shield plates dividing the inside of said shield case into a plurality of small sections;
   forming a printed circuit on one surface of a substrate and mounting circuit components of a high frequency circuit on the other surface of said thus printed substrate and with the terminals of said circuit components extending through said printed substrate, and mounting said substrate within each of said small sections with one surface facing downwardly and the other surface facing upwardly;
   forming in at least one of said shield case and said shield plates a fixing hole portion with a central portion thereof substantially level with the downwardly facing surface of said printed substrate, said fixing hole portion having a plurality of temporary steadying fingers spaced around the periphery thereof and extending into said fixing hole portion;
   bending said fingers laterally of said shield case or shield plate;
   inserting a feedthrough capacitor having a feedthrough terminal extending axially therethrough into said fixing hole portion with said temporary steadying fingers pressing against the outer periphery of said feedthrough capacitor for holding said feedthrough capacitor in said fixing hole portion with said feedthrough terminal at least adjacent said downwardly facing surface of said printed substrate; and
   immersing said device in solder to the level of the downwardly facing surface of said printed substrate for thereby soldering the terminals of said circuit components and said feedthrough terminal to said printed circuit and at the same time soldering said feedthrough capacitor to said shield case or said shield plate.

* * * * *